(12) United States Patent  
Morrone

(10) Patent No.: US 7,215,231 B1
(45) Date of Patent: May 8, 2007

(54) MRI SYSTEM

(75) Inventor: Terry Morrone, Greenlawn, NY (US)

(73) Assignee: Fonar Corporation, Melville, NY (US)

( * ) Notice: Subject to any disclaimer, the term of this patent is extended or adjusted under 35 U.S.C. 154(b) by 37 days.

(21) Appl. No.: 10/222,753

(22) Filed: Aug. 16, 2002

(51) Int. Cl.
H01F 5/00 (2006.01)
A61B 5/05 (2006.01)

(52) U.S. Cl. ............... 335/299; 335/302; 600/410
(58) Field of Classification Search ........... 335/299, 335/302–306; 600/410, 415
See application file for complete search history.

(56) References Cited

U.S. PATENT DOCUMENTS

| 4,093,912 A | * | 6/1978 | Double et al. ............ 324/320 |
| 4,636,756 A | | 1/1987 | Ito et al. |
| 4,672,346 A | * | 6/1987 | Miyamoto et al. ......... 335/296 |
| 4,673,882 A | | 6/1987 | Buford |
| 4,714,886 A | | 12/1987 | Halpern |
| 4,875,485 A | * | 10/1989 | Matsutani ............... 600/415 |
| 5,250,901 A | | 10/1993 | Kaufman et al. |
| 5,320,103 A | | 6/1994 | Rapoport et al. |
| 5,332,971 A | * | 7/1994 | Aubert ................. 324/319 |
| 5,347,252 A | | 9/1994 | Ries |
| 5,438,263 A | | 8/1995 | Dworkin et al. |
| 5,465,719 A | | 11/1995 | Itagaki et al. |
| 5,629,624 A | | 5/1997 | Carlson et al. |
| 5,647,361 A | | 7/1997 | Damadian et al. |
| 5,754,085 A | | 5/1998 | Danby et al. |
| 5,841,278 A | | 11/1998 | Green et al. |
| 5,992,006 A | | 11/1999 | Datsikas |
| 6,023,165 A | | 2/2000 | Damadian et al. |
| 6,029,081 A | | 2/2000 | DeMeester et al. |
| 6,075,364 A | | 6/2000 | Damadian et al. |
| 6,147,578 A | * | 11/2000 | Panfil et al. ............. 335/296 |
| 6,150,820 A | | 11/2000 | Damadian et al. |
| 6,166,617 A | | 12/2000 | Laskaris et al. |
| 6,201,394 B1 | | 3/2001 | Danby et al. |
| 6,208,145 B1 | | 3/2001 | Danby et al. |
| 6,218,838 B1 | | 4/2001 | McGinley et al. |
| 6,225,805 B1 | | 5/2001 | Damadian et al. |
| 6,249,695 B1 | | 6/2001 | Damadian |
| 6,278,274 B1 | | 8/2001 | Biglieri et al. |
| 6,280,383 B1 | | 8/2001 | Damadian |

(Continued)

Primary Examiner—K. Lee
Assistant Examiner—Bernard Rojas
(74) Attorney, Agent, or Firm—Brandon N. Sklar; Kaye Scholer LLP

(57) ABSTRACT

In one embodiment, a ferromagnetic frame for use in an MRI system comprises first and second opposing ferromagnetic elements magnetically coupled by a flux return path. First and second poles are provided, separated by a distance to define an imaging volume therebetween. The first pole is movably supported with respect to the first ferromagnetic element to vary the distance between the first and second poles. The first pole may have a first, imaging position and a second position wherein the first pole is farther from the second pole than in the first position. When the first pole is in the first, imaging position, a gap is provided between the first pole and the first ferromagnetic element. The second pole is supported by the second ferromagnetic element. When the first pole is in the second position, the imaging volume is made larger, providing room for medical personnel to access a patient. Performance of medical procedures on the patient is thereby facilitated. The flux return path may be two or more opposing ferromagnetic posts or plates, for example. Magnet assemblies, MRI systems, methods of conducting an MRI procedure and methods of conducting a medical procedure are also disclosed.

63 Claims, 11 Drawing Sheets

U.S. PATENT DOCUMENTS

| | | |
|---|---|---|
| 6,288,546 B1 | 9/2001 | Damadian et al. |
| 6,294,915 B1 | 9/2001 | Murphy et al. |
| 6,317,618 B1 | 11/2001 | Livni et al. |
| 6,333,630 B1 * | 12/2001 | Holsinger et al. .......... 324/319 |
| 6,335,670 B1 | 1/2002 | Kinanen |
| 6,340,888 B1 * | 1/2002 | Aoki et al. ................. 324/319 |
| 6,346,816 B1 * | 2/2002 | Damadian et al. .......... 324/319 |
| 6,411,187 B1 * | 6/2002 | Rotem et al. ............... 335/296 |
| 6,922,055 B1 * | 7/2005 | Damadian et al. .......... 324/318 |

* cited by examiner

MRI SYSTEM

FIELD OF THE INVENTION

The present invention relates to magnetic resonance imaging systems including a movable pole.

BACKGROUND OF THE INVENTION

Magnetic resonance imaging ("MRI") is a well-known, highly useful technique for diagnosing abnormalities in biological tissue. MRI can detect abnormalities that are difficult or impossible to detect by other techniques, without the use of x-rays or invasive procedures.

During an MRI procedure, the patient is inserted into an imaging volume of a primary field magnet. The magnet generates a static magnetic field through that causes the vector of the angular momentum or spin of nuclei containing an odd number of protons or neutrons to tend to align with the direction of the static magnetic field. A transmitting antenna proximate to the imaging volume emits a pulse or pulses of radio frequency energy. The radio frequency energy has a particular bandwidth of frequency, referred to as the resonant or Larmor frequency, that shifts the vectors of the nuclei out of alignment with the applied magnetic field. The spins of the nuclei then turn or "precess" around the direction of the applied primary magnetic field. As their spins precess, the nuclei emit small radio frequency signals, referred to as magnetic resonance ("MR") signals, at the resonant or Larmor frequency, which are detected by a radio frequency receiving antenna tuned to that frequency. The receiving antenna is typically positioned within the imaging volume proximate the patient. Linear, time-varying gradient magnetic fields are superimposed onto the static magnetic field to spatially encode the MR signals emitted by the nuclei and to define a particular image slice. After the cessation of the application of radio frequency waves, the precessing spins gradually drift out of phase with one another, back into alignment with the direction of the applied magnetic field. This causes the MR signals emitted by the nuclei to decay.

The same antenna may act as the transmitting and receiving antenna. The MR signals detected by the receiving antenna are amplified, digitized and processed by the MRI system. Hydrogen, nitrogen, phosphorous, carbon and sodium are typical nuclei detected by MRI. Hydrogen is most commonly detected because it is the most abundant nuclei in the human body and emits the strongest MR signal.

The rate of decay of the MR signals varies for different types of tissue, including injured or diseased tissue, such as cancerous tissue. By correlating the gradient magnetic fields and the particular frequency of the radio frequency waves applied at various times with the rate of decay of the MR signals emitted by the patient by known mathematical techniques, the concentrations and the condition of the environment of the nuclei of interest at various locations within the patient's body may be determined. This information is typically displayed as an image with varying intensities, which are a function of the concentration and environment of the nuclei of interest. Certain abnormalities in tissue, such as tumors, may be identified.

MRI can be of great assistance during medical procedures. For example, MRI has been used for pre-operative and postoperative imaging to identify and assess the condition of tissue of interest. MRI has also been used during fine-needle aspiration cytology to help the doctor guide the needle to the site of interest, such as a tumor. See, for example, U.S. Pat. No. 6,208,145 B1, assigned to the assignee of the present invention and incorporated by reference, herein. MRI has also been used in stereotactic neurosurgery. The advance of other instruments, such as a catheter or an endoscope, can also be followed and guided to a site of interest by MRI. See, for example, U.S. Pat. No. 6,249,695 B1 and U.S. Pat. No. 5,647,361, which are both assigned to the assignee of the present invention and incorporated by reference, herein. A catheter guided to a site of interest by MRI can be used in the treatment of tissue, such as a tumor, by delivering medication, isotopes or other such treatments, for example. MRI may also be used to monitor the affect of a treatment on the tissue, as the treatment is being conducted. See, for example, U.S. Pat. No. 6,208,145 B1 and U.S. Pat. No. 6,280,383 B1, both assigned to the assignee of the present invention and incorporated by reference herein.

To conduct surgery, the imaging volume needs to be large enough for one or more surgeons and other medical personnel to have clear and unimpeded access to the patient. In U.S. Pat. No. 6,208,145 B1, assigned to the assignee of the present invention and incorporated by reference herein, open MRI assemblies are disclosed wherein a physician or other medical personnel may conduct activities within the frame of the assembly, adjacent to the patient. In one embodiment, a ferromagnetic frame comprises two opposing vertical ferromagnetic plates connected to two opposing ferromagnetic pole supports. Opposing ferromagnetic poles extend towards each other, from the pole supports. Resistive or superconductive coils wrapped around the poles provide magnetic flux through the ferromagnetic frame. An imaging volume is defined between the opposing poles, for receiving at least a portion of a subject for imaging. The poles are above and below the patient. The regions around the sides of the patient are open, decreasing any claustrophobic reaction the patient may experience. In addition, medical personnel may access the patient through the open side regions, enabling performance of medical procedures on the patient while the patient is within the imaging volume and undergoing MRI.

The magnet assembly of the MRI system may define a room for conducting a medical procedure and may be large enough to contain an entire surgical team. The Quad™ 7000 and Quad™ 12000 Open MRI Systems, available from FONAR Corporation, Melville, N.Y., are also suitable for performing surgery and other medical procedures.

MRI systems in accordance with U.S. Pat. No. 6,208,145 B1 provide about 18–19 inches of open space between the opposing poles of the assembly. Additional room for the doctor to maneuver proximate imaging volume during a medical procedure may be provided by tapering the upper pole, as described in U.S. Pat. No. 6,346,816 B1, assigned to the assignee of the present invention and incorporated by reference herein. Additional room may also be provided by tapering portions of the bottom of a canopy of insulative material which typically covers the upper (and lower) pole and accessories, as described in U.S. Ser. No. 09/919,286, filed on Jul. 31, 2001 also assigned to the assignee of the present invention. The recessed or tapered portions enable the doctor or other such personnel in the room to lean into the imaging volume during a medical procedure. Two recessed portions are typically provided, symmetrically arranged around the periphery of the canopy.

Despite these improvements in the design of open MRI magnet assemblies to make them more conducive for conducting surgery, it would be advantageous to provide further room for medical personnel to access a patient in an imaging volume of an MRI magnet assembly.

In U.S. Pat. No. 6,029,081, several magnet assemblies are disclosed wherein one or both poles may be moved with respect to the imaging volume to provide room to conduct medical procedures. In one embodiment, the entire magnet assembly is supported on rollers or wheels on a track and can be moved along the track, away from the patient, when necessary. The assembly may be moved back into an imaging position when MR images are needed. In another embodiment, a portion of a magnet supporting an upper pole is rotatable or pivotable to move the upper pole out of the imaging volume. In another embodiment, a portion of the magnet and the pole are raised by a lifting mechanism to enlarge the imaging volume. The lifting mechanism is movable along a track on the ceiling to move the magnet and pole out of the way. In another embodiment, the magnet and both of the supported poles are separable in three directions, horizontally. These designs are complex and impractical. Movement of the ferromagnetic elements would require that the magnetic field be shut down in all but the smallest magnets. After such a shut down, when MRI is desired, the magnet would need to be reassembled and allowed to warm up, causing long delays during the medical procedure.

SUMMARY OF THE INVENTION

In accordance with the present invention, the size of the imaging volume between opposing poles of a ferromagnetic frame used in an MRI System may be increased to facilitate access of the patient by medical personnel during a medical procedure, for example, and/or to facilitate positioning of the patient in the imaging volume, by moving one of the poles.

In accordance with one embodiment of the invention, a magnetic resonance imaging ("MRI") magnet assembly is disclosed, comprising a ferromagnetic frame. The frame comprises opposing, vertical, ferromagnetic elements. Opposing, horizontal, upper and lower ferromagnetic pole supports are connected to the vertical ferromagnetic supports. Opposing upper and lower poles are provided, separated by a distance to define an imaging volume therebetween. A source of magnetic flux is associated with the ferromagnetic frame. The lower pole is supported by the lower ferromagnetic pole support. The upper pole is movably supported with respect to the upper pole support to vary the distance between the upper pole and the lower pole. Additional room may be provided in the imaging volume by moving the upper pole away from the lower pole, towards the upper pole support, facilitating access of a patient in the imaging volume by medical personnel. Performance of medical procedures is thereby facilitated. Magnetic resonance imaging may be conducted, when needed, by moving the upper pole closer to the lower pole.

Stationary ferromagnetic material may be provided around the upper pole, to facilitate movement of the upper pole. The upper pole and the ferromagnetic extension each have a respective magnetic center of mass. The ferromagnetic material is positioned such that the magnetic center of mass of the ferromagnetic extension is above the magnetic center of mass of the upper pole when the upper pole is in the first position and the magnetic center of mass of the ferromagnetic extension is below the magnetic center of mass of the upper pole when the upper pole is in the second position. The ferromagnetic material may be connected to and extend from the vertical ferromagnetic elements. The ferromagnetic material may comprise a plurality of ferromagnetic segments extending from the vertical ferromagnetic elements.

To move the upper pole, at least one rod may be provided having a first end coupled to the upper pole and a second end coupled to a motor supported by the ferromagnetic frame. Activation of the motor causes movement of the at least one rod to raise or lower the upper pole. Alternatively, a chamber may be supported by the ferromagnetic frame. A piston is received within the chamber and a piston rod is coupled to the first pole and to the piston. Driving fluid selectively provided to the chamber moves the piston within the chamber to raise or lower the upper pole. Other types of mechanisms may be provided to move the first pole, as well.

In accordance with another embodiment of the invention, a ferromagnetic frame for use in an MRI system is disclosed comprising first and second opposing ferromagnetic elements. A flux return path magnetically couples the first and second ferromagnetic elements. First and second opposing ferromagnetic poles are provided, separated by a distance to define an imaging volume therebetween. The first pole is movably supported with respect to the first ferromagnetic element to vary the distance between the first and second poles. The second pole is supported by the second ferromagnetic element. Means for movably supporting the first pole with respect to the first ferromagnetic element may be provided.

The flux return path may comprise at least one vertical ferromagnetic structure and the opposing ferromagnetic elements may be horizontal. For example, the flux return path may comprise at least two opposing vertical ferromagnetic plates connected to each ferromagnetic element, a plurality of ferromagnetic posts or a cylindrical ferromagnetic structure. The flux return path may also be a C-shaped ferromagnetic structure.

In accordance with another embodiment of the invention, an MRI system is disclosed comprising first and second opposing ferromagnetic elements. A flux return path magnetically couples the first and second ferromagnetic elements. First and second opposing ferromagnetic poles are also provided, separated by a distance to define an imaging volume therebetween. The first pole is movably supported with respect to the first ferromagnetic element to vary the distance between the first and second poles. The second pole is supported by the second ferromagnetic element. Means for movably supporting the first pole with respect to the first ferromagnetic element may be provided.

In accordance with another embodiment of the invention, an MRI system is disclosed comprising a ferromagnetic frame. The frame comprises opposing, first and second ferromagnetic pole supports and a ferromagnetic structure providing a flux return path between the ferromagnetic pole supports. Opposing first and second poles are separated by a distance defining an imaging volume therebetween. A source of magnetic flux is associated with the frame. A gradient field generating system is provided within the imaging volume. The first pole is movably supported with respect to the first pole support to selectively vary the distance between the first and second poles. The second pole is supported by the second ferromagnetic pole support. A radio frequency transmitting and receiving coil system may also be provided within the imaging volume.

In accordance with another embodiment of the invention, a method of conducting a medical procedure on a subject in a imaging volume of an MRI system is disclosed, wherein the MRI system comprises opposing first and second ferromagnetic pole supports and opposing first and second ferromagnetic poles. The ferromagnetic poles define an imaging volume therebetween. The method comprises conducting a magnetic resonance imaging scan of at least a portion of the subject within the imaging volume with the first pole in a first position with respect to the first pole support. The first pole is moved to a second position with respect to the first pole support, wherein the second position is further from the second pole than the first position, increasing the distance between the poles. Additional room is thereby provided within the imaging volume. A medical procedure is performed on the subject while the first pole is in the second position. The first pole may be moved to the first position after performing at least a portion of the medical procedure and a second magnetic resonance imaging scan may be conducted again. The medical procedure may be the excision of cancerous tissue, for example.

In accordance with another embodiment, a method of conducting an MRI procedure on a subject in an imaging volume of an MRI system is disclosed, wherein the system comprises opposing first and second ferromagnetic pole supports and opposing first and second ferromagnetic poles. The ferromagnetic poles define an imaging volume therebetween. The first pole has a first, imaging position and a second, non-imaging position wherein the first pole is farther from the second pole than in the first position. The method comprises positioning a subject in the imaging volume while the first pole is in the second position and advancing the first pole to the first position. An MRI scan is conducted while the first pole is in the first position. A medical procedure may be performed while the first pole is in the second position.

In the following description, the term "pole unit" is used to refer to a ferromagnetic pole element and accompanying accessories. In the claims, the term "pole" is used to refer to the ferromagnetic pole element, with or without the accompanying accessories.

DESCRIPTION OF THE PREFERRED EMBODIMENTS

Figure 1:
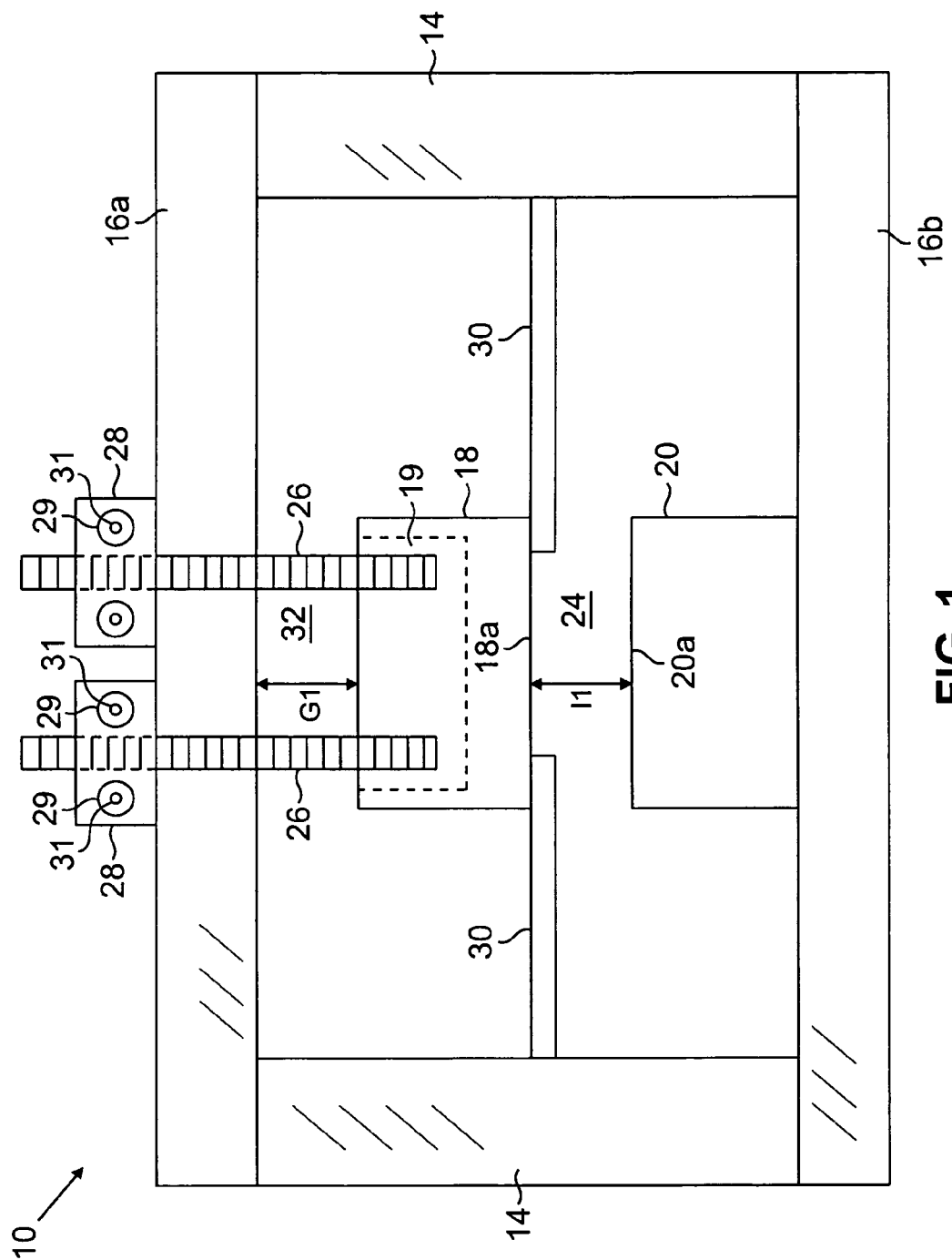
FIG. 1 is a side view of an Open MRI magnet assembly in accordance with one embodiment of the present invention, with an upper pole unit in a first position for imaging.

FIG. 1 is a schematic side view of an Open MRI magnet assembly 10 in accordance with one embodiment of the present invention. The magnet assembly 10 comprises vertical, opposing ferromagnetic elements 14 connected at their ends to opposing, horizontal, upper and lower ferromagnetic pole supports 16a, 16b, respectively. The pole supports 16a, 16b support a first pole unit 18 and a second pole unit 20, each having opposing pole faces 18a, 20a, respectively. In this embodiment, the first pole unit 18 is an upper pole unit and the second pole unit 20 is a lower pole unit. The upper and lower pole units 18, 20 are separated by a distance to define an imaging volume 24 for receiving a subject (not shown) to undergo an MRI procedure or an MRI guided medical procedure. In FIG. 1, the upper pole unit 18 is in a first position for imaging, wherein the upper pole unit and the lower pole unit 20 are separated by a distance 11. The magnet assembly 10 is typically situated in a shielded room, to block interference from external radio frequency sources, as is known in the art. The shielding around the room may be a Faraday shield, for example.

In this embodiment, the ferromagnetic elements 14 may be two opposing ferromagnetic plates, as described in U.S. Pat. No. 6,201,394 B1. Two pairs of opposing ferromagnetic plates may be provides as well. Four or more ferromagnetic posts, as described in U.S. Pat. No. 6,201,394 B1, U.S. Pat. No. 6,075,364 and U.S. Pat. No. 5,754,085 which are assigned to the assignee of the present invention and are incorporated by reference herein. The ferromagnetic elements 14 and pole supports 16a, 16b may be of iron or steel, for example.

Figure 2:
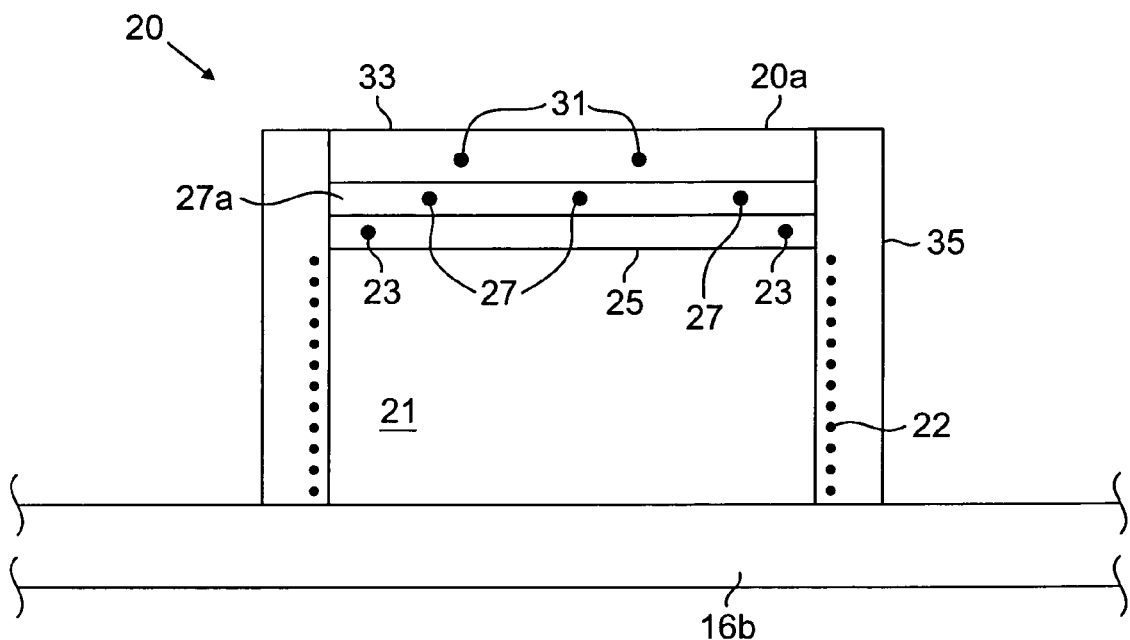
FIG. 2 is a cross-sectional view of an example of a lower pole unit 20 used in the magnet assembly of FIG. 1.

FIG. 2 is a cross-sectional view of an example of a lower pole unit 20. The corresponding upper pole unit 18 has a similar configuration but in reverse order. Other differences between the lower pole unit 20 and the upper pole unit 18 are discussed further, below. The lower pole unit 20 comprises a ferromagnetic pole element 21 of steel, for example. Electromagnetic coils 22 are provided around the ferromagnetic pole element 21 to induce magnetic flux across the imaging volume 24 and around the magnet assembly 10. The coils 22 may be resistive or superconducting, as is known in the art. Instead of coils, the source of electromagnetic flux may be permanent magnets. The permanent magnets may be embedded in the ferromagnetic elements 14, in the ferromagnetic pole supports 16a, 16b, and/or in the ferromagnetic pole elements 21, for example, as described in U.S. Pat. No. 6,208,145 B1, which is assigned to the assignee of the present invention and is incorporated by reference herein.

Other known components of the MRI system 10 associated with the lower pole unit 20 (and upper pole unit 18) in this example include shim coils 23 for adjusting the magnetic field. The shim coils 23 are supported in a shim coil plate 25. Gradient field generating coils 27 are also provided within a gradient coil plate 27a. A transmitter coil 31 supported in a transmitter coil plate 33 may be provided. A transmitter coil spacer plate (not shown) is typically provided between the transmitter coil plate 33 and the gradient coil plate 27a. Portions of the transmitter coil 31 lie in a plane parallel to the pole faces 18a, 20a. Other types of transmitter coils may be used, as well. For example, the transmitter coil 31 need not be rectangular and need not be coupled to the pole units 18, 20.

Instead of active shimming with the shim coils 23, passive shimming may also be provided by a metal shim supported by a shim plate or plates, as described in U.S. Pat. No. 5,992,066, which is assigned to the assignee of the present invention and incorporated by reference herein. The surface of the ferromagnetic pole element 21 may also be varied to improve the uniformity of the magnetic field, as described in U.S. Pat. No. 6,208,145 B1, which is assigned to the assignee of the present invention and is incorporated by reference, herein. Ferromagnetic bars or rings may also be added to the pole units, as is known in the art as described in U.S. Pat. No. 6,346,816 B1, which is assigned to the assignee of the present invention and is incorporated by reference, herein. Passive shimming techniques are also described in U.S. Pat. No. 6,225,805 B1, which is also assigned to the assignee of the present invention and incorporated by reference, herein.

The shim, gradient and transmitter coil plates 25, 29, 33 are typically made of a flame retardant, insulative material, such as polyvinylchloride ("PVC"), for example. A canopy 35 of flame retardant, insulative material, such as PVC, also covers the upper and lower pole units 18, 20 and the sides of the shim coil plate 25, gradient coil plate 29 and transmitter coil plate 33, as shown in FIG. 2.

A patient bed (not shown in FIG. 1) is provided over the lower pole unit 20, at least partially within the imaging volume 24. The bed may be a typical bed used in MRI procedures. Preferably, the bed can move into and out of the imaging volume 24, can rotate in either direction about a polar axis through the pole units 18, 20 of the MRI magnet assembly 10, can move along a plane perpendicular to the polar axis and can tilt about a longitudinal axis of the bed. Thus, it can be disposed in any radial direction with any part of the patient's body in the imaging volume 24. A suitable bed is described in U.S. Pat. No. 6,208,145, for example, assigned to the assignee of the present invention and incorporated by reference, herein.

Returning to FIG. 1, the magnet assembly 10 is large enough for medical personnel, such as a doctor, to access the imaging volume 24 and a patient within the imaging volume. A medical procedure may therefore be conducted on the patient within the imaging volume 24. The magnet assembly 10 may be large enough to define a room for conducting the medical procedure, as described in U.S. Pat. No. 6,225,805 B1, for example, which is assigned to the assignee of the present invention and is incorporated by reference herein.

Figure 3:
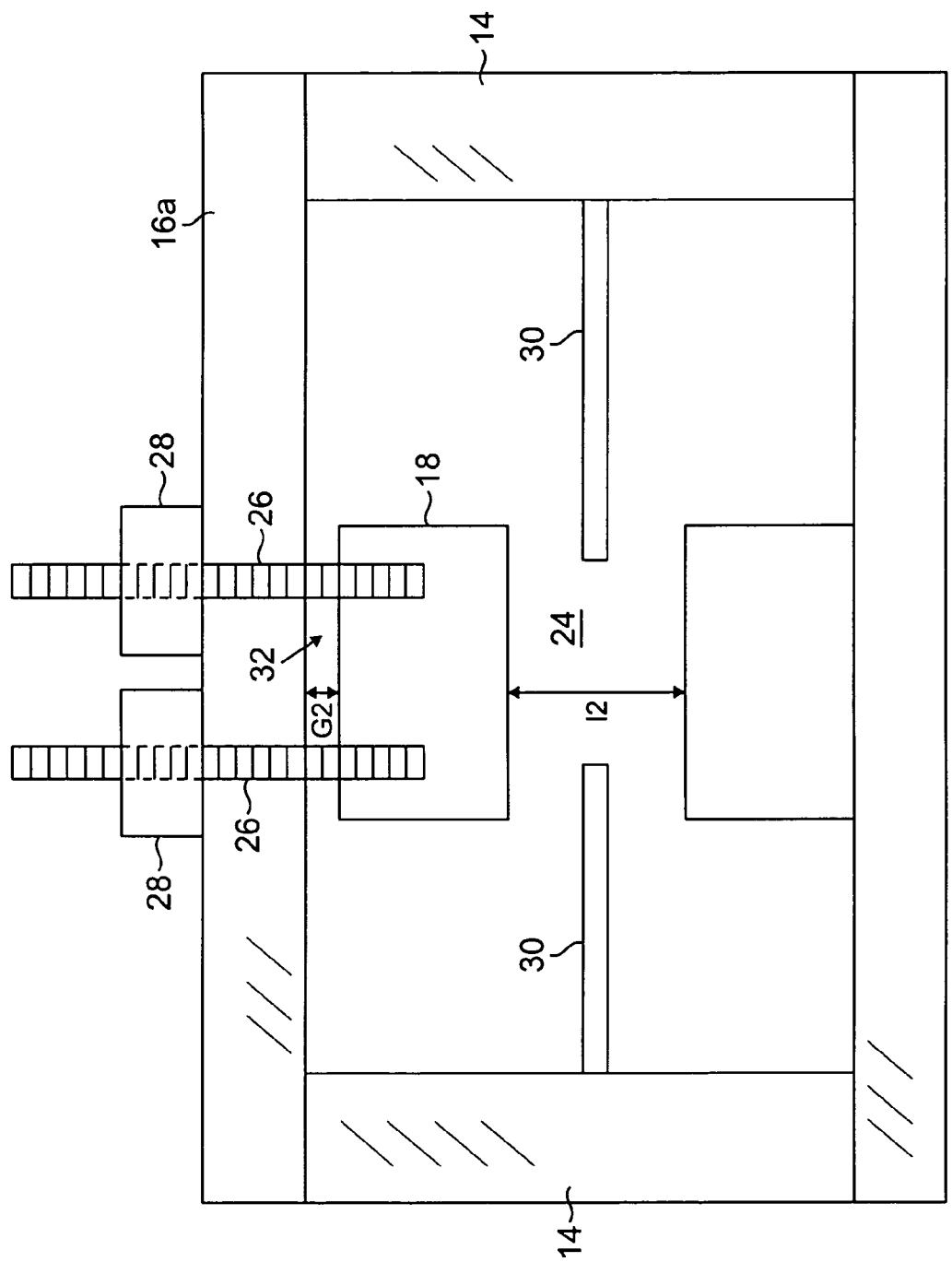
FIG. 3 is a side view of the magnet assembly of FIG. 1, with the upper pole unit in a second position, increasing the size of the imaging volume.

As mentioned above, in FIG. 1, the upper pole unit 18 is in a first, imaging position wherein there is a distance I1 between the upper pole unit and the lower pole unit 20. In accordance with an embodiment of the invention, additional room is provided within the imaging volume 24 by moving the upper pole unit 18 to a second position with a distance I2 between the upper pole support and the lower pole support, as shown in FIG. 3, wherein the distance I2 is greater than the distance I1. By providing additional room in the imaging volume 24, access to a patient to conduct a medical procedure, for example, is facilitated.

The upper pole unit 18 may be moved between the first and second positions by movably supporting the upper pole unit 18 with respect to the upper pole support 16a. A gap 32 is provided between the upper pole support 16a and the upper pole unit 18 when the upper pole unit 18 is in the first position, to accommodate movement of the upper pole unit, as shown in FIG. 1. In the embodiment of FIG. 1, one or more movable rods 26 are provided to raise and lower the upper pole unit 18. The rods 26 have first, lower end portions that are threaded for being screwed into the ferromagnetic pole elements 19a of the pole unit 18. The rods 26 may be connected to the upper pole unit 18 by other means, as well.

For example, the rods may be welded to the upper pole unit 18. The rods 26 may be made of ferromagnetic material such as steel. 1006 steel may be used, for example.

The movable rods 26 extend through the upper pole support 16a to respective motor boxes 28 for raising and lowering the rods. The rods 26 may have second, upper end portions with parallel threads, for example, and the motor boxes 28 may include gears 29 (shown schematically in FIG. 1) coupled to the threads on the rods 26. The gears 29 may be driven by one or more motor shafts 31. Two, counter rotating motor shafts 31 are shown in FIG. 1. Rotation of the motor shafts 31 causes rotation of the gears 29, moving the rods 26 and the upper pole unit 18 up or down, depending on the direction of rotation.

Other mechanisms for moving the rods 26 may be used, as well. For example, the rods may be connected to one or more pistons movable within one or more chambers by hydraulic or pneumatic force, as shown and described with respect to FIG. 5. A hoist or winch may also be used.

In addition to providing space for movement of the upper pole unit 18 from the first to the second position, the gap 32 is believed to ease movement of the upper pole unit 18 against the attractive forces exerted by the lower pole unit 20 and the force of gravity. As the upper pole unit 18 is raised from the first position to the second position, the distance G1 of the gap 32 becomes smaller and the attractive force between the upper pole support 16a and the upper pole unit 18 increases, assisting in the upward movement of the upper pole unit. Meanwhile, the attractive force between the upper pole unit 18 and the lower pole unit 20 decreases, which also facilitates the upward movement of the upper pole unit. In addition, the imaging volume 24 becomes larger. As the upper pole unit 18 is lowered from the second position to the first position, the height of the gap 32 becomes larger and the imaging volume 24 becomes smaller. The attractive force between the upper pole unit 18 and the upper pole support 16a decreases, facilitating downward movement of the upper pole unit. Meanwhile, the attractive force between the upper pole unit 18 and the lower pole unit 20 (and the lower pole support 16a) increases, also facilitating downward movement of the upper pole unit 18. The resultant magnetic force on the upper pole unit 18 stays substantially constant.

The sum of the distances G1, G2 of the gap 32 and the distances I1, I2 of the imaging volume 24 remain the same as the upper pole 18 is moved. (G1+I1=G2+I2=K). Since the total air space (gap 32 plus imaging volume 24) remains constant as the upper pole 18 is moved, the magnetic potential energy of the system also stays substantially constant.

In one example, the height G1 of the gap 32 may be about 30 inches and the length I1 of the imaging volume 24 may be about 20 inches when the upper pole unit 18 is in the first, imaging position. The height G2 of the gap 32 may be about 10 inches and the length I2 of the imaging volume 24 may be about 40 inches when the upper pole unit 18 is in its second position.

Due to the presence of the gap 32, the MRI assemblies 10 of FIG. 1 of the embodiments herein will have greater airspace than a conventional open MRI system. Greater current is therefore required to drive the electromagnetic coils than if the gap 32 was filled with ferromagnetic material. Because of this, superconducting coils are preferred.

The surgeon or other medical personnel can control the activation of the motor boxes 28 through a user interface device, such as a mouse or a keyboard supported on the patient bed and electrically or electromagnetically coupled to a computer controlling operation of the MRI system. An example of a control and processing system for an MRI system incorporating the magnet assemblies of the present invention is described further, below. The motor boxes 28 may also be controlled through the interface device or through another control device. The activation of the motor boxes 28 could also be controlled by a technician in a control room, under the verbal direction of the surgeon or other medical personnel.

Activation of the user interface device 41 automatically advances the upper pole unit 18 from the first, imaging position to the second position. Alternatively, the MRI system 10 may be configured such that the upper pole unit 18 may be moved from the first, imaging position, to any desired position above the first position. For example, depression of a button on a mouse or a keyboard may cause continuous movement of the upper pole 18 until the button is released or the gap 32 is closed. As the procedure is progressing, the upper pole 18 may be lowered to the first position whenever imaging is desired.

Figure 4:
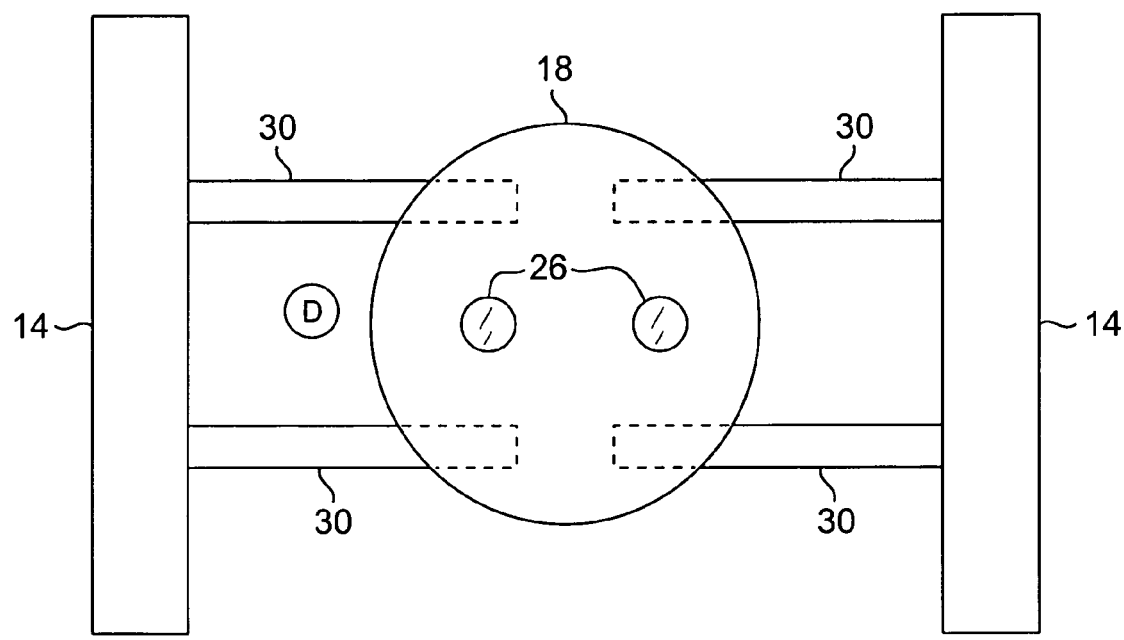
FIG. 4 is a top view of the magnet assembly of FIG. 1, with the upper pole support removed.

Stops 30 of steel or other such material may also extend from the vertical supports 14, to define the location of the first, lowered position and support the upper pole 18 when it is in the first, lowered position. A vertical support (not shown) may extend from bottom pole support 16b (or a floor above the lower pole support 16b) to the stops 30, to reinforce the stops. FIG. 4 is a top view of the magnet assembly 10 of FIG. 1, with the upper pole support 16a removed. Four stops 30 are shown, for supporting the periphery of the upper pole unit 18. More or fewer stops 30 may be provided.

There is a position of the upper pole 18 where the attractive forces on the upper pole 18 from the upper pole support 16a and the lower pole 20 substantially cancel and the rods 26 need only support the weight of the upper pole unit 18. The first and second positions of the upper pole 18 are preferably within a range of positions where the resultant magnetic forces are small.

Figure 5:
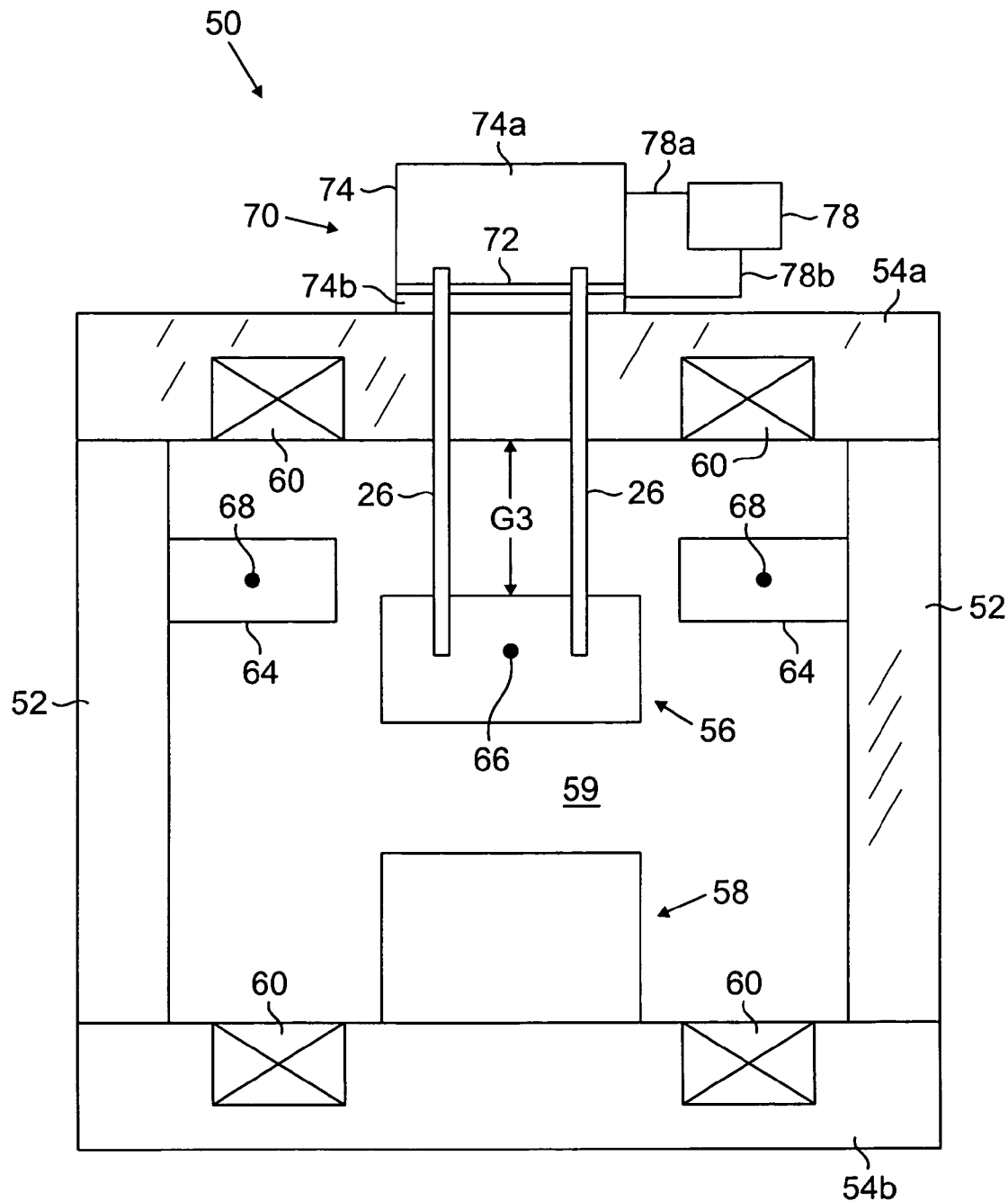
FIG. 5 is a side view of another magnet assembly in accordance with the another embodiment of the present invention, with an upper pole unit in a first position for imaging.

This range of positions may be extended and movement of the upper pole 18 may be further facilitated by providing ferromagnetic material adjacent to the upper pole unit as shown in FIG. 5. FIG. 5 is a side schematic view of another magnet assembly 50 in accordance with the present invention. The magnet assembly 50 comprises four vertical ferromagnetic elements 52 connected at their ends to upper and lower horizontal pole supports 54a, 54b, respectively. The four ferromagnetic elements are shown connected along their side edges in FIG. 7, where the upper pole support 54a is removed. Upper and lower pole units 56, 58 are supported by the upper and lower horizontal pole supports 54a, 54b, respectively. An imaging volume 59 is defined between the upper and lower pole units 56, 58. The pole units 56, 58 have the same configuration as the pole unit 20 of FIG. 2, except that in this embodiment, electromagnetic coils 60 are embedded in the upper and lower pole supports 54a, 54b for generating magnetic flux through the magnet assembly 50 and across the imaging volume 59. A gap 63 is provided between the upper pole unit 56 and the upper poles support 54a.

Figure 6:
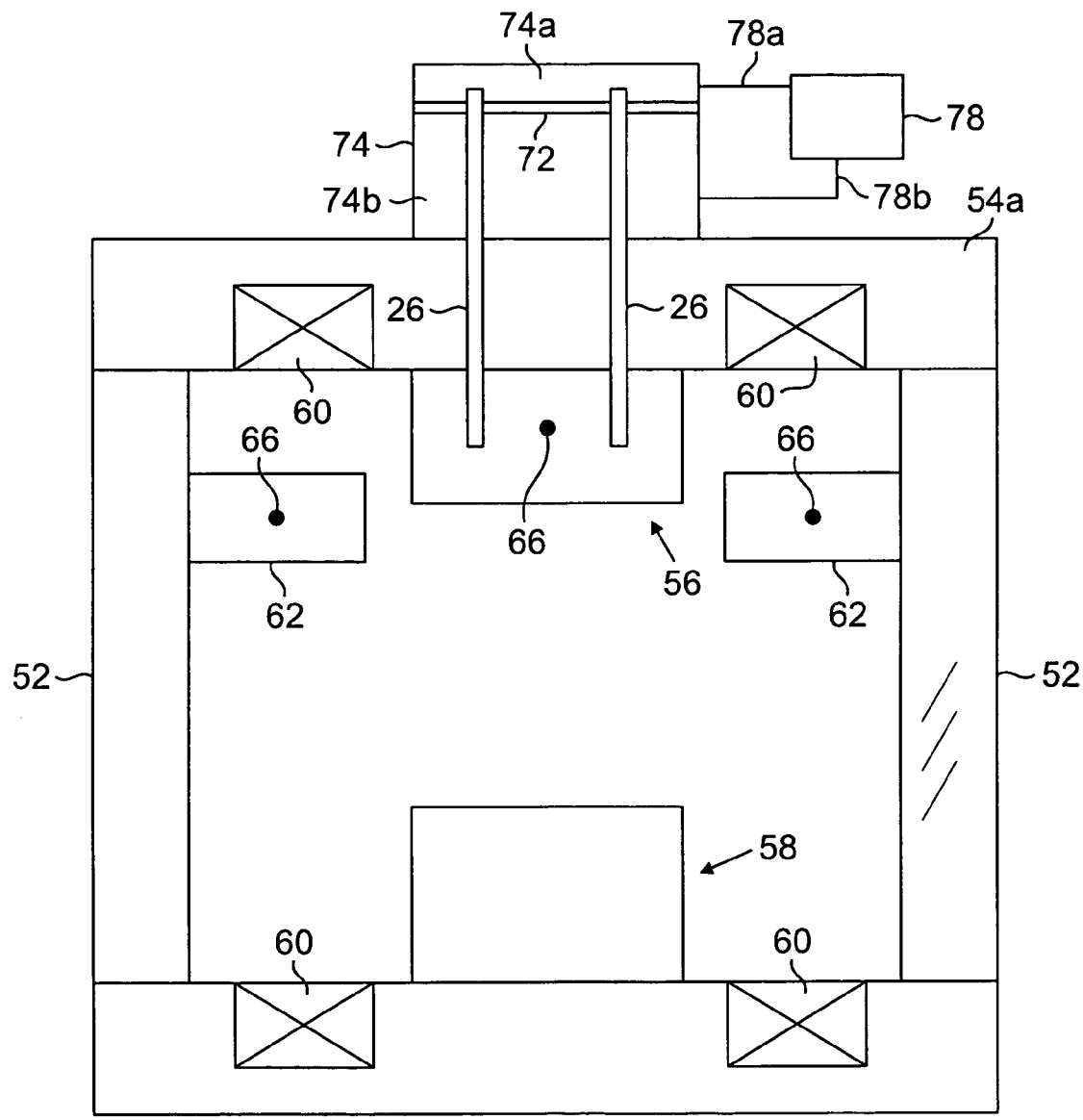
FIG. 6 is a side view of the magnet assembly of FIG. 5, with the upper pole unit in a second position, increasing the size of the imaging volume.

In the embodiment of FIG. 5, ferromagnetic material 64 is symmetrically arranged around the upper pole unit 56. The ferromagnetic material may be connected to and extend from the vertical ferromagnetic elements 52, towards the polar axis P, as shown in FIG. 5. The ferromagnetic material 62 may be supported by the lower pole support 54b or a floor above the lower pole support, instead of or along with its connection to the vertical ferromagnetic elements 52. The ferromagnetic material 64 may be in the form of segments or may be continuous. The ferromagnetic material 64 is positioned so that when the upper pole unit 56 is in the first position for imaging, the magnetic center of mass 66 of the upper pole unit 56 is below the magnetic center of mass 68 of the side pieces 64, farther from the upper pole support 54a, as shown in FIG. 6. The ferromagnetic material 64 thereby provides a further attractive force toward the upper pole support 54a, countering the attractive magnetic force towards the lower pole 58, and gravity. Movement from the first position to the second position is thereby facilitated.

In FIG. 6, the upper pole unit 56 is in a second position. In this example, the gap 63 has a length G2 of essentially zero as the upper pole unit 56 is substantially adjacent to the upper pole support 54a. The gap may have a non-zero length G2 as shown in FIG. 1, as well. The center of mass 66 of the upper pole unit 56 is above the center of mass 66 of the ferromagnetic material 62, closer to the upper pole support 54a. The sidepieces 62 provide an attractive force toward the lower pole unit 20, countering the attractive magnetic force towards the upper pole support 16a. The resultant magnetic force on the upper pole 18 is thereby decreased, facilitating movement of the upper pole unit 56 back to its first position.

In the embodiment of FIGS. 5 and 6, a hydraulic or pneumatic positioning system 70 moves the upper pole unit 56 with respect to the upper pole support 54a. The positioning system 70 comprises a piston 72 within a housing 74 defining an interior chamber. The piston 72 divides the chamber into two chambers 74a, 74b. The piston 72 is connected to the rods 26. A pump 78 selectively pumps a driving fluid, such as air, water or oil, for example, into and out of each chamber 74a, 74b along lines 76a, 76b. The pump 78 may be controlled by the computer controlling operation of the MRI system, through the user interface device, as discussed above.

Figure 7:
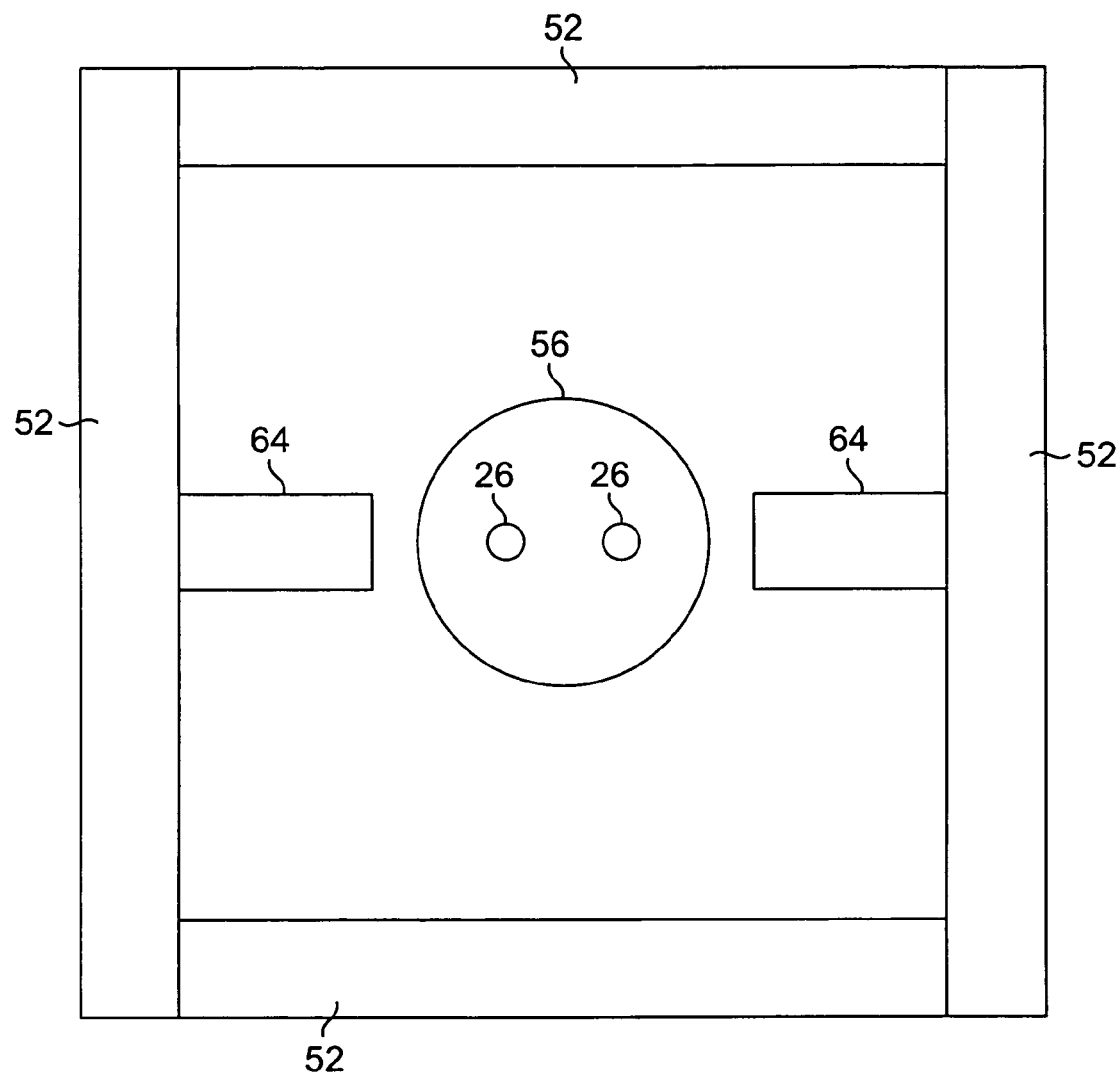
FIG. 7 is a top view of the magnet assembly of FIG. 5, with the upper pole support removed.

As mentioned above, FIG. 7 is a top view of the magnet assembly of FIG. 5 with the upper pole support 54a removed, showing the four ferromagnetic plates 52 connected along their sides. FIG. 7 also shows the two segments of ferromagnetic material 64 and the upper pole unit 56. In this example, the sidepieces are rectangular. The medical personnel may stand and maneuver between the segments 64 of ferromagnetic material.

Figure 8:
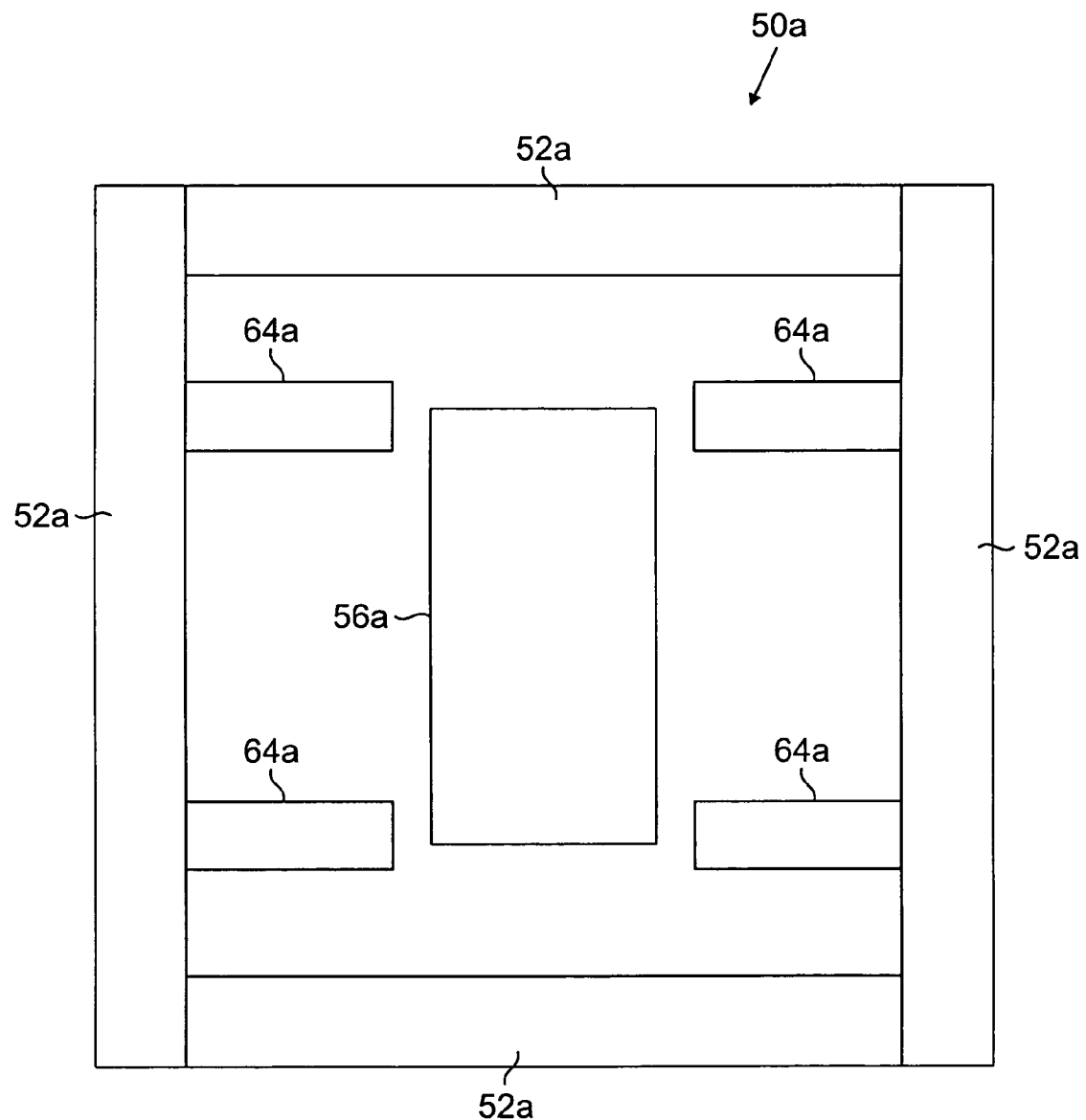
FIG. 8 is a top view of the magnet assembly 50a with the upper pole support 54a removed, where the pole units are rectangular.

FIG. 8 is a top view of the another magnet assembly 50a with the upper pole support 5a removed. Four ferromagnetic plates 52a and a rectangular upper pole unit 5ba are shown. The lower pole unit (not shown) is rectangular, as well. Here the pole units 56a, 58a are rectangular. Four sidepieces 64a of ferromagnetic material are shown symmetrically positioned with respect to the rectangular upper unit 5ba. As above, the medical personnel may stand and maneuver between the segments 64 of ferromagnetic material.

Figure 9:
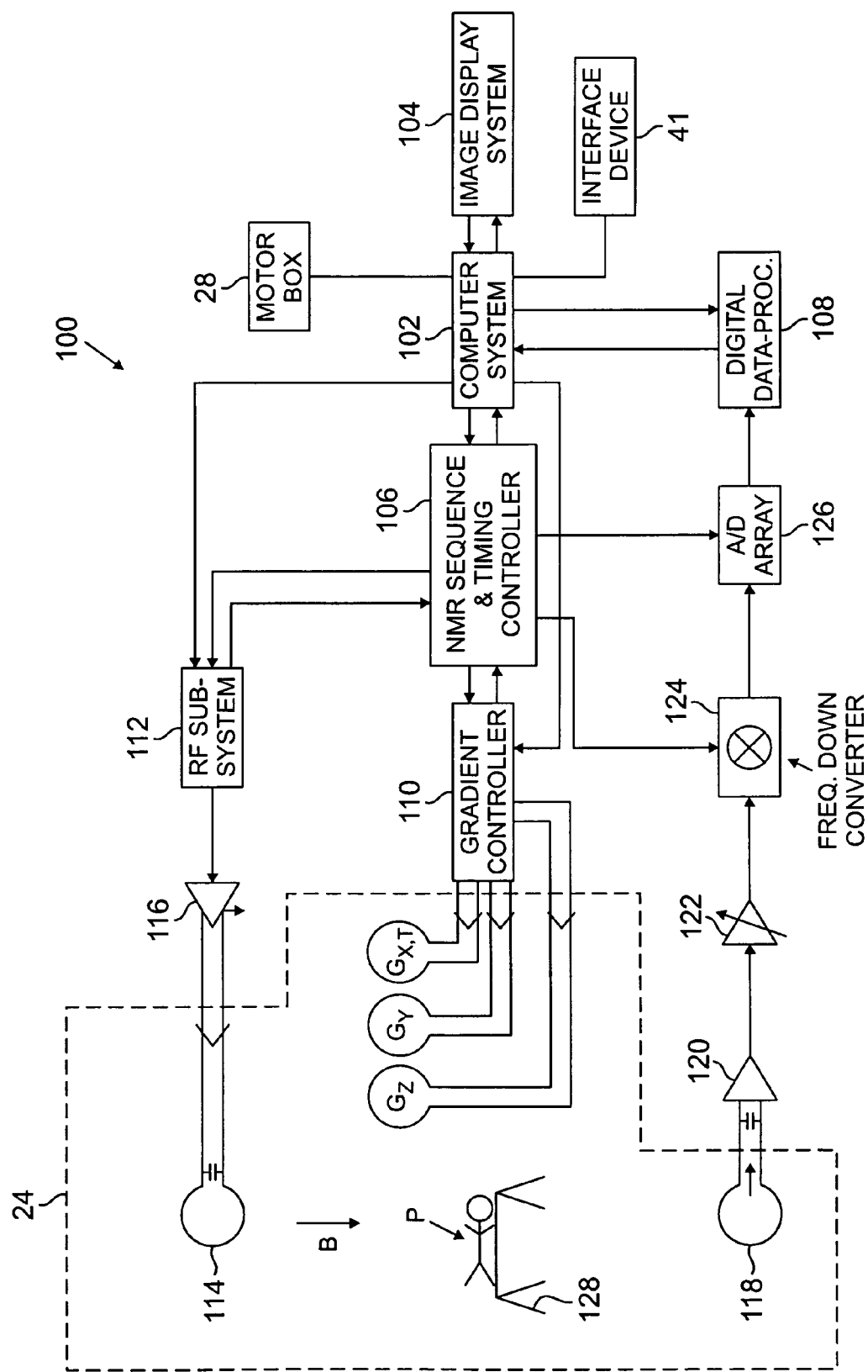
FIG. 9 is a block diagram of an exemplary MRI system 100 including control and processing components.

FIG. 9 is a schematic representation of an exemplary MRI system 100 including control and processing components, such as a computer 102, an image display system 104, a nuclear magnetic resonance sequence and timing controller ("NMR controller") 106 and a digital data processor 108. The system 100 also includes a gradient controller 110 that controls gradient coils Gx, Gy, Gz, and a radio frequency transmitter subsystem ("RF subsystem") 112 including a transmitter coil 114 coupled to an amplifier 116.

A receiver coil 118 is coupled to the digital data processor through a pre-amplifier 120, a variable amplifier 122, a frequency divider or frequency down converter ("FDC") 124 and an analog-to-digital converting array ("A/D array") 126. The digital data processor 108 is typically coupled to the A/D array 126 through a data bus (not shown). While separate transmitter and receiver coils 114, 118 are shown, a single coil can be used to both transmit radio frequency pulses and to receive MR signals, as is known in the art.

The transmitter coil 114, the gradient coils Gx, Gy, Gz, the receiving coil 118 and the pre-amplifier 120 are within the imaging volume 24 between the pole units 18, 20 in FIG. 1. The transmitter coil 114 and the gradient coils may be supported in plates coupled to the pole units 18, 20, for example, as discussed above with respect to FIG. 2. A patient P is shown resting on a bed 128 within the imaging volume 24. The receiver coil 118 is positioned proximate the patient P.

The computer 102 is a real time computer with submicrosecond timing precision that controls the overall operation of the MRI System 100. The computer 102 has outputs connected to inputs of the image display system 104, NMR controller 106, digital data processor 108, gradient controller 110 and RF subsystem 112. The computer 102 also has inputs connected to outputs of the image display system 104, NMR controller 106 and digital data processor 108. Predetermined pulse sequences are stored in the computer 102. The computer 102 provides the pulse sequence selected by the operator to the NMR controller 106 for execution. The computer 102 also controls the operation of the motor boxes 28 in response to inputs from a user interface device 41, as discussed above. The computer 102 controls operation of the shim coils 23, as well.

The NMR controller 106 is a microprocessor based timing controller or other programmable device that stores and executes the pulse sequence provided by the computer 102. A clock (not shown) in the NMR controller 106 synchronizes the entire MRI System 100. The NMR controller 106 has outputs connected to inputs of the gradient controller 110 and RF subsystem 112. The NMR controller 106 also has outputs connected to inputs of the FDC 124 and A/D array 126. The NMR controller 18 has inputs connected to outputs of the gradient controller 110 and RF subsystem 12, as well. The NMR controller 106 may be part of the computer 102.

The gradient controller 110 is a microprocessor, such as a digital signal processor (DSP). The gradient controller 110 is connected to the gradient coils Gx, Gy, Gz through digital-analog-converters and amplifiers (neither of which are shown). The gradient coils Gx, Gy, Gz generate orthogonal linear magnetic fields within the imaging volume along the X, Y and Z axes, respectively, under the control of the gradient controller 110. The gradient controller 110 includes a waveform generator (not shown) containing a waveform stored in digital form and a phase encoding waveform. The magnitudes and directions of the gradient fields to be generated by each coil Gx, Gy, Gz during a particular pulse sequence are provided by the computer 102 to the gradient controller 110, which stores the information.

When instructed by the computer 102, the NMR controller 106 executes the pulse sequence provided by the computer by providing a synchronization pulse for indicating the start of a scanning procedure and timing pulses for controlling the operation of the various subsystems, to the A/D array 126, RF subsystem 112 and the gradient controller 110. For example, in response to a pulse or pulses from the NMR controller 106, the gradient controller 110 causes the output of a particular waveform or waveforms for a desired pulse sequence to each of the gradient coils Gx, Gy, Gz. The NMR controller 106 also provides a series of pulses to the A/D array 126 indicating when the A/D array should sample the signal provided by the frequency down converter 124. The NMR controller 106 similarly provides a series of pulses to the RF subsystem 112 for initiating the injection of radiofrequency pulses of particular values, as determined by the pulse sequence, into the imaging volume 24.

The use of an MRI system including the MRI magnet assemblies of the invention will be described with respect to the embodiment of FIG. 1. In accordance with an embodiment of the invention, a patient P is positioned on the patient bed 128 in the imaging volume 24 of the MRI assembly 10. The upper pole unit 18 may be in the second position, if desired, to facilitate positioning of the patient P. The upper pole unit 18 may then be lowered to its first position, shown in FIG. 1. Alternatively, the upper pole unit 18 may be in its first position during positioning of the patient. MRI may be conducted prior to the start of a medical procedure. After this initial imaging, the upper pole unit 18 is raised to the second position, as shown in FIG. 4, and medical personnel conduct the medical procedure. Whenever MRI imaging is needed, the upper pole unit 18 may be lowered to the first position by activation of the interface device 41 by one of the medical personnel in the room or through an oral command to a technician in a control room.

One example of a procedure that could benefit from conducting MRI during the procedure is removal of cancerous tissue. While it is often difficult to visually distinguish between cancerous tissue and normal tissue, cancerous tissue may be more readily identified on an MR image. It may therefore be helpful to a surgeon to periodically conduct MRI as the cancerous tissue is being excised, to locate additional cancerous tissue that needs to be removed or to confirm that the cancerous tissue has been removed. The upper pole unit 18 may be readily lowered whenever imaging is desired. After each imaging scan, the upper pole unit 18 may be raised to the second position to continue the operation, as necessary.

Other medical procedures that may be facilitated by conducting MRI during the procedure include, without limitation, minimally and non-minimally invasive procedures such as biopsies, laproscopy, procedures using catheters or endoscopes and treatment regimens, such as injecting an isotope or other treatment into a tumor, for example.

The MRI systems and magnet assemblies of the present invention may also be useful in performing imaging procedures without performing medical procedures. For example, the ability to position the patient in a larger imaging volume while the upper pole is in its second position may facilitate imaging of injured, sick, difficult to position, claustrophobic and otherwise nervous patients. The MRI systems and magnet assemblies of the present invention may also enable medical personnel to gain rapid access to individuals in distress.

The MRI systems 10 and 50 are examples of MRI systems that may be used in the present invention. The movable pole of the present invention may be used with other types of MRI systems known in the art, particularly those conducive for conducting medical procedures.

Figure 10:
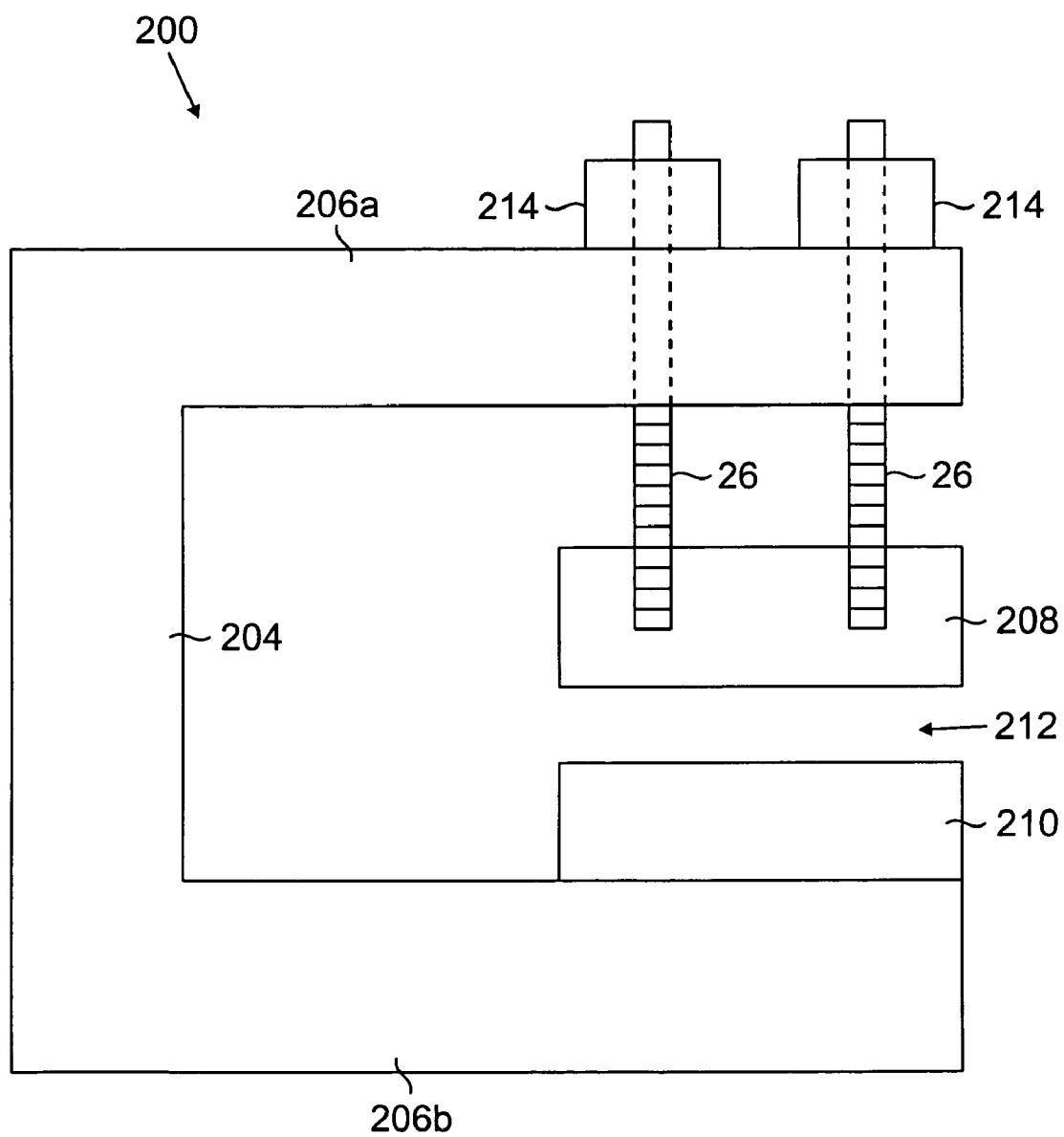
FIG. 10 is a side view of a C-magnet assembly incorporating an embodiment of the present invention.

For example, FIG. 10 is a schematic representation of an MRI assembly 200 wherein the flux return path is a C-shaped magnet assembly 202. The magnet assembly comprises one vertical portion 204. Upper and lower pole supports 206a, 206b are connected to the vertical portion 204. Opposing upper and lower pole units 208, 210 define an imaging volume 212 therebetween. The pole units 208, 210 may have the structure described above with respect to the pole unit 20, or another structure known in the art. The lower pole unit 210 is connected to the lower pole support 206b. A gap 214 is provided between the upper pole unit 208 and the upper pole support 206a. The upper pole unit 208 is movably supported by threaded rods 26 extending through the upper pole support 206*a*, to motor boxes 214, or other such mechanism, as discussed above. Operation of the motor box 214 moves the upper pole unit 208 between a first imaging position and a second, operative position, as described above with respect to FIGS. 1 and 3. Ferromagnetic material may be provided around the upper pole unit 208 to facilitate movement of the upper pole unit, as described above with respect to FIG. 5. C-shaped ferromagnetic magnet assemblies are described in U.S. Pat. No. 6,075,364, for example, which is assigned to the assignee of the present invention and is incorporated by reference, herein.

A C-shaped magnet assembly may be arranged to form an upright magnet assembly for imaging a patient in a standing or sitting position, as is also disclosed in U.S. Pat. No. 6,075,364. To form an upright magnet assembly, the C-shaped magnet assembly may be rotated 90° about an axis C in FIG. 10. In an upright magnet assembly, a magnetic field extends across the imaging volume in a horizontal orientation, instead of a vertical orientation, as in the magnet assemblies 10 and 50. The patient is situated within the imaging volume in a standing or sitting position between the pole units. Ferromagnetic material may also be provided around the moving pole unit to facilitate movement of the pole unit, as described above with respect to FIG. 5.

Figure 11:
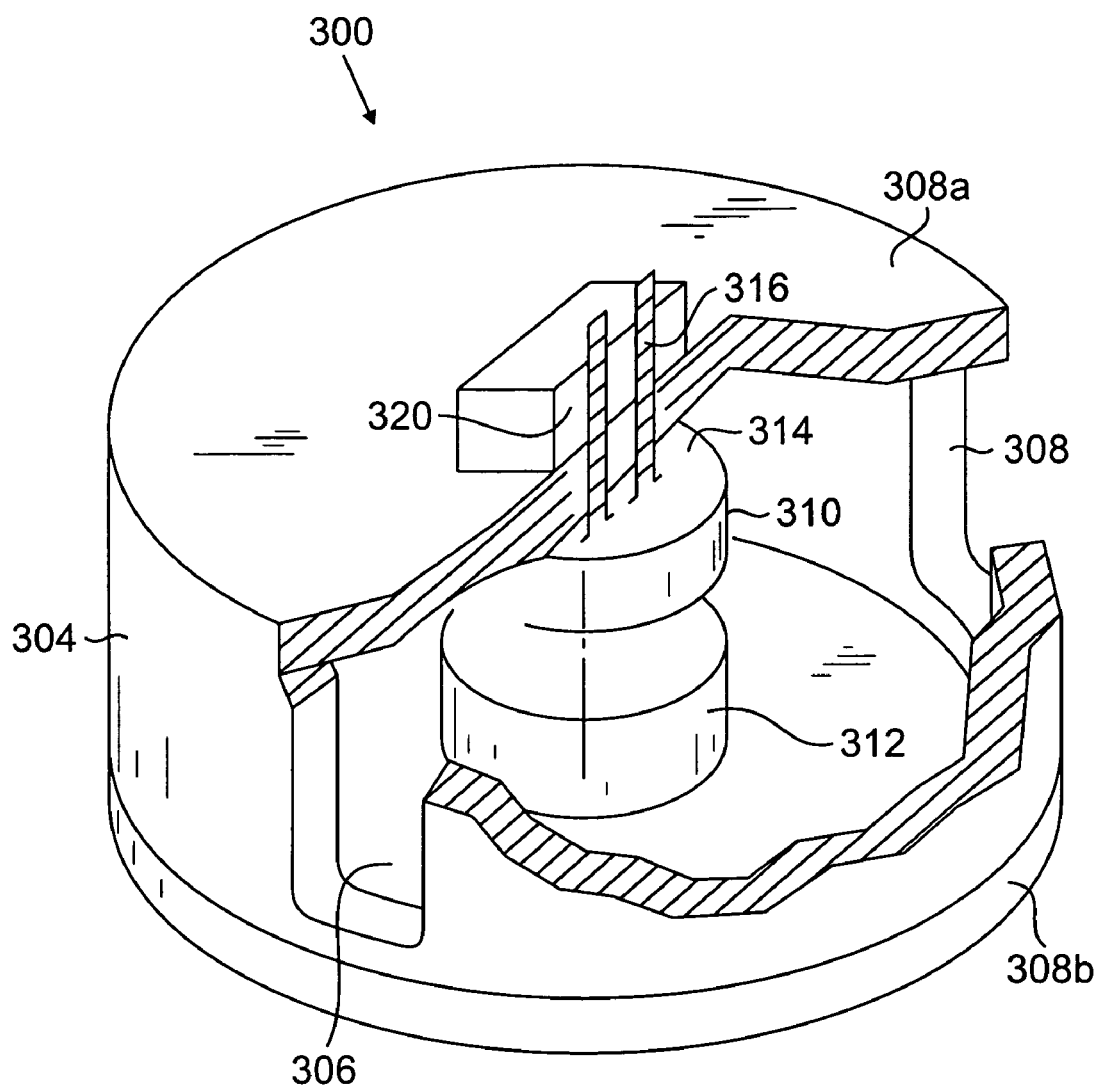
FIG. 11 is a perspective, partially cut away view of a cylindrical magnet assembly incorporating an embodiment of the present invention.

FIG. 11 is a partially cutaway, perspective view of an MRI magnet assembly 300 wherein the flux return path is a vertical ferromagnetic cylinder 304 comprising sectors of a cylinder or other body of revolution. Two openings 306 are provided through the cylinder 304 to allow entry and exit of the patient and medical personnel. Upper and lower pole supports 308*a*, 308*b*, in the form of circular plates, are connected to the ferromagnetic cylinder 304. Upper and lower pole units 310, 312 are provided, as well. The lower pole unit 312 is supported by the lower pole support 308*b*. A gap 314 is provided between the upper pole unit 310 and the upper pole support 308*a*. The upper pole unit 310 is supported by movable, threaded rods 316, which extend through the upper pole support 308*a* to a motor box 320 or other such mechanism, as described above. Such a configuration is also described in U.S. Pat. No. 6,201,394 B1, which is also assigned to the assignee of the present invention and is incorporated by reference, herein. Ferromagnetic material may be provided around the upper pole unit 310 to facilitate movement of the upper pole unit, as described above with respect to FIG. 5.

Other MRI magnet assembly configurations may incorporate the present invention, as well.

One of skill in the art will understand that other modifications may be made to the embodiments described above without going beyond the scope of the present invention, which is defined by the following claims.

I claim:

1. A magnetic resonance imaging (MRI) magnet assembly, comprising:
    a ferromagnetic frame comprising:
    opposing, vertical, ferromagnetic elements;
    opposing, horizontal, upper and lower ferromagnetic pole supports connected to the vertical ferromagnetic supports;
    opposing upper and lower poles separated by a distance to define an imaging volume therebetween;
    at least one member extending from each vertical ferromagnetic element; and
    a source of magnetic flux associated with the ferromagnetic frame;
    wherein:
    the lower pole is supported by the lower ferromagnetic pole support;
    the upper pole is movably supported with respect to the upper pole support to vary the distance between the upper pole and the lower pole between one position, wherein the upper pole is separated from the lower pole by a first distance, and an other position, wherein the upper pole is separated from the lower pole by a second distance greater than the first distance; and
    the at least one member is positioned to support the upper pole when the upper pole is in the one position, and not support the upper pole when the upper pole is in the other position.

2. The MRI magnet assembly of claim 1, wherein:
    in the one position, the upper pole and the upper pole support are separated by a third distance defining a gap; and
    in the other position, the upper pole and the upper pole support are separated by a fourth distance, the fourth distance being in a range from about zero to a distance less than the third distance.

3. The MRI magnetic assembly of claim 2, wherein:
    a sum of the first distance between the upper pole and the lower pole and the third distance between the upper pole and the upper pole support when the upper pole is in the one position is equal to a sum of a fifth distance between the upper pole and the lower pole and the fourth distance between the upper pole and the upper pole support when the upper pole is in the other position.

4. The MRI magnet assembly of claim 1, further comprising:
    stationary ferromagnetic material around the upper pole;
    wherein the upper pole and the ferromagnetic material each have a respective center of mass; and
    the ferromagnetic material is positioned such that the magnetic center of mass of the ferromagnetic material is above the magnetic center of mass of the upper pole when the upper pole is in the one position and the magnetic center of mass of the ferromagnetic material is below the magnetic center of mass of the upper pole when the upper pole is in the other position.

5. The MRI magnet assembly of claim 4, wherein the ferromagnetic material is connected to and extends from the vertical ferromagnetic elements.

6. The MRI magnet assembly of claim 4, wherein the ferromagnetic material comprises a plurality of ferromagnetic segments extending from the vertical ferromagnetic elements.

7. The MRI magnet assembly of claim 1, wherein each one of the opposing, vertical ferromagnetic elements is a ferromagnetic plate.

8. The MRI magnetic assembly of claim 1, wherein each one of the opposing vertical ferromagnetic elements is a ferromagnetic post.

9. The MRI magnetic assembly of claim 1, further comprising:
    at least one rod having a first end coupled to the upper pole and a second end; and
    at least one motor supported by the frame and coupled to the second end of the at least one rod such that activation of the at least one motor causes movement of the at least one rod to raise or lower the upper pole.

10. The MRI magnet assembly of claim 1, further comprising:
a chamber supported by the frame;
a piston received within the chamber; and
a piston rod coupled to the first pole and to the piston;
wherein driving fluid selectively provided to the chamber moves the piston, to raise or lower the upper pole.

11. The MRI magnetic assembly of claim 1, wherein the source of magnetic flux comprises electromagnetic coils.

12. The MRI magnetic assembly of claim 11, wherein the electromagnetic coils are superconducting coils.

13. A ferromagnetic frame for use in a magnetic resonance imaging system, the frame comprising:
first and second opposing ferromagnetic elements;
a flux return path magnetically coupling the first and second ferromagnetic elements;
first and second opposing ferromagnetic poles separated by a distance to define an imaging volume therebetween; and
at least one member within the frame;
wherein:
the first pole is movably supported with respect to the first ferromagnetic element to vary the distance between the first and second poles between one position, wherein the first pole is separated from the second pole by a first distance, and an other position, wherein the first pole is separated from the second pole by a second distance greater than the first distance;
the at least one member is positioned within the frame to support the first pole when the first pole is in the first position, and not support the first pole when the first pole is in the second position; and
the second pole is supported by the second ferromagnetic element.

14. The ferromagnetic frame of claim 13, wherein:
the flux return path comprises at least one vertical ferromagnetic structure; and
the opposing ferromagnetic elements are horizontal.

15. The ferromagnetic frame of claim 14, wherein the flux return path comprises at least two opposing vertical ferromagnetic plates connected to each ferromagnetic element.

16. The ferromagnetic frame of claim 13, wherein the flux return path comprises a plurality of ferromagnetic posts.

17. The ferromagnetic frame of claim 13, wherein the flux return path comprises a cylindrical ferromagnetic structure.

18. The ferromagnetic frame of claim 13, wherein the flux return path comprises a C-shaped ferromagnetic structure.

19. The ferromagnetic frame of claim 13, wherein:
in the one position, the first pole and the first ferromagnetic element are separated by a third distance defining a gap; and
in the other position, the first pole and the second pole are separated by a fourth distance, the fourth distance being in a range of from about zero to a distance less than the second distance.

20. The ferromagnetic frame of claim 19, wherein:
a sum of the first distance between the first pole and the second pole and the third distance between the first pole and the first ferromagnetic element when the first pole is in the one position is equal to a sum of a fifth distance between the first pole and the second pole and the fourth distance between the first pole and the first ferromagnetic element when the first pole is in the other position.

21. The ferromagnetic frame of claim 13, further comprising means for movably supporting the first pole with respect to the first ferromagnetic element.

22. The ferromagnetic frame of claim 13, further comprising:
at least one motor supported by the frame; and
at least one rod having a first end coupled to the first pole and a second end coupled to the at least one motor such that activation of the at least one motor causes movement of the at least one rod to move the first pole.

23. The ferromagnetic frame of claim 22, wherein:
the first ferromagnetic element has a first surface facing the first pole and a second surface opposite the first surface;
the at least one motor is supported by the second surface; and
the at least one rod extends through the first ferromagnetic element.

24. The ferromagnetic frame of claim 21, further comprising:
a chamber supported by the first ferromagnetic element;
a piston received within the chamber; and
a piston rod coupled to the first pole and to the piston,
wherein driving fluid selectively provided to the chamber moves the piston within the chamber, to move the first pole.

25. The ferromagnetic frame of claim 19, further comprising:
stationary ferromagnetic material around the first pole;
wherein the first pole and the stationary ferromagnetic material each have a respective magnetic center of mass; and
the stationary ferromagnetic material is positioned such that the magnetic center of mass of the ferromagnetic extension is closer to the first ferromagnetic element than the magnetic center of mass of the first pole when the first pole is in the one position and the magnetic center of mass of the first pole is closer to the first ferromagnetic element than the magnetic center of mass of the ferromagnetic extension when the first pole is in the other position.

26. The ferromagnetic frame of claim 25, wherein the ferromagnetic material is coupled to and extends from the ferromagnetic structure.

27. The ferromagnetic frame of claim 13, further comprising means for generating magnetic flux.

28. A magnetic resonance imaging (MRI) system, comprising:
first and second opposing ferromagnetic elements;
a flux return path magnetically coupling the first and second ferromagnetic elements;
first and second opposing ferromagnetic poles separated by a distance to define an imaging volume therebetween; and
a control device;
wherein:
the entire first pole is movably supported with respect to the first ferromagnetic element to vary the distance between the first and second poles;
the second pole is supported by the second ferromagnetic element; and
the control device controls movement of the entire first pole between an imaging position, wherein the first pole is a first distance from the second pole, and an other position, wherein the first pole is a second distance from the second pole, the second distance being greater than the first distance.

29. The MRI system of claim 28, further comprising means for movably supporting the first pole with respect to the first ferromagnetic element.

30. The MRI system of claim 28, further comprising:
at least one motor supported by the first ferromagnetic element; and
at least one rod having a first end coupled to the first pole and a second end coupled to the at least one motor, such that activation of the at least one motor causes movement of the at least one rod to move the first pole.

31. The MRI system of claim 28, further comprising:
a chamber supported by the first ferromagnetic element;
a piston received within the chamber; and
a piston rod coupled to the first pole and to the piston;
wherein driving fluid selectively provided to the chamber moves the piston within the chamber, to move the first pole.

32. The MRI system of claim 28, wherein:
in the imaging position, the first pole and the first ferromagnetic element are separated by a second distance defining a gap; and
in the other position, the first pole and the second pole are separated by a third distance, the third distance being in a range of from about zero to a distance less than the second distance.

33. The MRI system of claim 32, wherein:
a sum of the first distance between the first pole and the second pole and the second distance between the first pole and the first ferromagnetic element when the first pole is in the first position is equal to a sum of a fourth distance between the first pole and the second pole and the third distance between the first pole and the first pole support when the first pole is in the second position.

34. A magnetic resonance imaging (MRI) system, comprising:
a ferromagnetic frame comprising:
opposing, first and second ferromagnetic pole supports;
a ferromagnetic structure connected to the first and second ferromagnetic pole supports to provide a flux return path between the ferromagnetic pole supports; and
opposing first and second poles separated by a distance to define an imaging volume therebetween;
the MRI system further comprising:
a source of magnetic flux associated with the frame;
a gradient field generating system within the imaging volume; and
a processor;
wherein:
the entire first pole is movably supported with respect to the first pole support to selectively vary the distance between the first and second poles;
the second pole is supported by the second ferromagnetic pole support; and
the processor controls movement of the entire first pole between one predetermined position, wherein the first pole is a first predetermined distance from the second pole, and an other predetermined position, wherein the first pole is a second predetermined distance from the second pole, the second distance being greater than the first distance.

35. The MRI system of claim 34, further comprising a radio frequency transmitting and receiving coil system within the imaging volume.

36. The MRI system of claim 35, wherein the radio frequency transmitting and receiving system comprises at least one coil to transmit radio frequency signals and to receive magnetic resonance signals.

37. The MRI system of claim 34, further comprising means for movably supporting the first pole with respect to the first ferromagnetic pole support;
wherein the processor controls the means.

38. The MRI system of claim 34, further comprising:
at least one motor supported by the frame; and
at least one rod having a first end coupled to the first pole and a second end coupled to the at least one motor such that activation of the at least one motor causes movement of the at least one rod, to move the first pole;
wherein the processor controls the motor.

39. The MRI system of claim 38, wherein:
the first ferromagnetic pole support has a first surface facing the first pole and a second surface opposite the first surface;
the at least one motor is supported by the second surface; and
the at least one rod extends through the first ferromagnetic pole support, from the motor to first pole.

40. The MRI system of claim 34, further comprising:
a chamber supported by frame;
a piston received within the chamber; and
a piston rod coupled to the first pole and to the piston;
wherein driving fluid selectively provided to the chamber moves the piston within the chamber, to move the first pole, under the control of the processor.

41. The MRI system of claim 34, wherein:
the first pole has a first position with respect to the first ferromagnetic pole support, wherein the first pole and the first ferromagnetic pole support are separated by a second distance defining a gap while the first pole is in the first position; and
the first pole has a second position with respect to the first ferromagnetic pole support, wherein the first pole and the first pole support are separated by a third distance, the third distance being in a range from about zero to a distance less than the second distance.

42. The MRI system of claim 41, further comprising:
stationary ferromagnetic material around the first pole;
wherein the first pole and the stationary ferromagnetic material have respective magnetic centers of mass; and
the stationary ferromagnetic material is positioned such that the magnetic center of mass of the ferromagnetic extension is closer to the first ferromagnetic pole support than the magnetic center of mass of the first pole when the first pole is in the first position and the magnetic center of mass of the first pole is closer to the first ferromagnetic pole support than the magnetic center of mass of the ferromagnetic extension when the first pole is in the second position.

43. The MRI system of claim 34, wherein the source comprises superconducting coils.

44. A method of conducting a medical procedure on a subject in a imaging volume of an magnetic resonance imaging system, the system comprising opposing first and second ferromagnetic pole supports and opposing first and second ferromagnetic poles, the ferromagnetic poles defining an imaging volume therebetween, the method comprising:
conducting a magnetic resonance imaging scan of at least a portion of the subject within the imaging volume with the first pole in one position with respect to the first pole support;
moving the entire first pole to an other position with respect to the first pole support, the second position being further from the second pole than the one position; and performing a medical procedure on the subject while the first pole is in the other position.

45. The method of claim 44, further comprising:
moving the first pole to the one position after conducting at least a portion of the medical procedure; and then conducting a second magnetic resonance imaging scan.

46. The method of claim 45, wherein the medical procedure is excision of cancerous tissue, the method comprising:
(a) conducting a magnetic resonance imaging scan with the first pole in the one position to generate at least one magnetic resonance image to locate cancerous tissue;
(b) moving the first pole to the other position;
(c) excising at least a portion of the cancerous tissue identified on the magnetic resonance image;
(d) returning the pole to the one position; and
(e) repeating a)–d) until the cancerous tissue is removed.

47. A method of conducting a magnetic resonance imaging procedure on a subject in an imaging volume of a magnetic resonance imaging system, the system comprising opposing first and second ferromagnetic pole supports and opposing first and second ferromagnetic poles, the ferromagnetic poles defining an imaging volume therebetween, wherein the first pole has an imaging position and a non-imaging position wherein the first pole is farther from the second pole than in the imaging position, the method comprising:
positioning a subject in the imaging volume while the first pole is in the non-imaging position;
advancing the entire first pole to the imaging position; and
conducting a magnetic resonance imaging scan while the first pole is in the imaging position.

48. The method of claim 47, further comprising:
advancing the first pole to the non-imaging position; and
performing a medical procedure on the subject while the first pole is in the non-imaging position.

49. A method of conducting a magnetic resonance imaging procedure on a subject in an imaging volume of a magnetic resonance imaging system, the imaging volume being defined between opposing first and second ferromagnetic poles, the method comprising:
positioning a subject in the imaging volume while the first pole is in a subject positioning position with respect to the second pole, wherein the first and second poles are separated by a first distance;
advancing the entire first pole to an imaging position wherein the first and second poles are separated by a second distance less than the first distance; and
conducting at least one magnetic resonance imaging scan while the first pole is in the second position.

50. The method of claim 49, further comprising:
advancing the first pole to the subject positioning position prior to positioning the subject in the imaging volume.

51. The method of claim 49, further comprising:
advancing the first pole to a third position, wherein the first and second poles are separated by a third distance greater than the subject positioning distance.

52. The method of claim 51, wherein the third distance is the same as the subject positioning position.

53. The method of claim 51, further comprising:
advancing the first pole to the third position; and
performing a medical procedure on the subject while the first pole is in the third position.

54. The method of claim 53, further comprising:
returning the first pole to the first, imaging position; and then
conducting at least one additional magnetic resonance imaging scan while the first pole is in the imaging position.

55. A magnetic resonance imaging (MRI) system, comprising:
first and second opposing ferromagnetic elements;
a flux return path magnetically coupling the first and second ferromagnetic elements;
a first ferromagnetic pole suspended from the first ferromagnetic element;
a second ferromagnetic pole supported by the second ferromagnetic element the first and second poles being opposing and being separated by a distance to define an imaging volume therebetween; and
means for uniformly moving the entire first pole with respect to the first ferromagnetic element from one position, wherein the first and second poles are separated by a first distance, to an other position, wherein the first and second poles are separated by a second distance different than the first distance.

56. The MRI system of claim 55, wherein the means comprises:
at least one member coupled to the first pole; and
a motor to uniformly move the at least one member.

57. The MRI system of claim 55, wherein:
the means further comprises a control device to control the means.

58. The MRI system of claim 57, wherein:
the control device comprises a computer.

59. The MRI system of claim 57, further comprising:
a user interface device coupled to the control device, to provide input related to movement of the first pole.

60. A method of operating an MRI system, comprising:
conducting an MRI scan of a subject positioned, at least in part, in an imaging volume of an MRI system, while a first pole of the MRI system is in one position with respect to a second pole of the MRI system; and then
advancing the entire first pole from the one position to an other position with respect to the second pole while the subject is positioned, at least in part, in the imaging volume.

61. The method of claim 60, further comprising:
conducting a medical procedure on the subject after moving the first pole to the other position.

62. A magnetic resonance imaging (MRI) system, comprising:
first and second opposing, horizontal ferromagnetic elements;
a flux return path magnetically coupling the first and second ferromagnetic elements;
a first ferromagnetic pole supported by the first ferromagnetic element;
a second ferromagnetic pole supported by the second ferromagnetic element the first and second poles being separated by a distance to define an imaging volume there between; and
at least one member coupled to the first pole and to the first ferromagnetic element; and
a motor coupled to the at least one member to uniformly move the entire first ferromagnetic pole from one position, wherein the first and second poles are separated by a first distance, to an other position, wherein the first and second poles are separated by a second distance different than the first distance.

63. The MRI system of claim 55, wherein:
the means further comprises a control device to control the means;

the extension is positioned such that the magnetic center of mass of the ferromagnetic extension is closer to the first ferromagnetic element than the magnetic center of mass of the first pole when the first pole is in the first position and the magnetic center of mass of the first pole is closer to the first ferromagnetic element than the magnetic center of mass of the ferromagnetic extension when the first pole is in the second position.

* * * * *